(12) United States Patent
Drory et al.

(10) Patent No.: US 8,171,384 B2
(45) Date of Patent: May 1, 2012

(54) DEVICE HAVING TURBO DECODING CAPABILITIES AND A METHOD FOR TURBO DECODING

(75) Inventors: Guy Drory, Givataim (IL); Ron Bercovich, Kfar-Saba (IL); Yosef Kazaz, Tel Aviv (IL); Aviel Livay, Holon (IL); Yonatan Naor, Hertzelia (IL); Yuval Neeman, Ashquelon (IL)

(73) Assignee: Freescale Semiconductor, Inc., Austin, TX (US)

( * ) Notice: Subject to any disclaimer, the term of this patent is extended or adjusted under 35 U.S.C. 154(b) by 978 days.

(21) Appl. No.: 12/163,638

(22) Filed: Jun. 27, 2008

(65) Prior Publication Data

US 2009/0327834 A1    Dec. 31, 2009

(51) Int. Cl.
    *H03M 13/03* (2006.01)
(52) U.S. Cl. .................................. 714/796; 714/792
(58) Field of Classification Search ............. 714/792, 714/796
    See application file for complete search history.

(56) References Cited

U.S. PATENT DOCUMENTS

| | | | |
|---|---|---|---|
| 6,829,313 B1 * | 12/2004 | Xu | 375/341 |
| 6,996,194 B2 * | 2/2006 | Pukkila et al. | 375/340 |
| 7,092,464 B2 * | 8/2006 | Mills | 375/346 |
| 2002/0099985 A1 * | 7/2002 | Cheng | 714/704 |
| 2003/0014700 A1 | 1/2003 | Giulietti et al. | |
| 2004/0148556 A1 * | 7/2004 | Hagh et al. | 714/755 |
| 2004/0237025 A1 * | 11/2004 | Beerel et al. | 714/796 |
| 2005/0052293 A1 * | 3/2005 | Yamazaki | 341/50 |
| 2006/0039509 A1 * | 2/2006 | Galili et al. | 375/341 |
| 2007/0055919 A1 | 3/2007 | Li et al. | |
| 2007/0162837 A1 * | 7/2007 | Nieminen | 714/796 |
| 2007/0177696 A1 | 8/2007 | Chen et al. | |

FOREIGN PATENT DOCUMENTS

| | | |
|---|---|---|
| EP | 1276242 B1 | 1/2006 |
| JP | 07-094717 | 7/1995 |
| KR | 10-2008-0038682 A | 7/2008 |

OTHER PUBLICATIONS

Dobkin, Rostislav et al., "Parallel VLSI Architecture for Map Turbo Decoder", IEEE 2002 PIMRC, vol. 1, pp. 384-388, Sep. 15-18, 2002.
Hsu, Jah-Ming et al., "A Parallel Decoding Scheme for Turbo Codes", IEEE 1998 ISCAS, vol. 4, pp. 445-448, May 31-Jun. 3, 1998.
International Application No. PCT/US2009/048268, International Search Report and Written Opinion dated Jan. 29, 2010.
Dielissen, J. et al.; "Implementation Issues of 3rd Generation Mobile Communication Turbo Decoding"; 21st Symposium on Information Theory, Benelux; May 2000; pp. 9-16; Wassenaar, The Netherlands.

* cited by examiner

*Primary Examiner* — M. Mujtaba K Chaudry

(57) ABSTRACT

A device and a method for turbo decoding, the method includes performing multiple iterations of a turbo decoding process until a turbo decoding process is completed; wherein the performing comprises repeating the stages of: (i) initializing at least one state metric of multiple windows of a channel data block for a current iteration of the turbo decoding process by at least one corresponding state metric that was calculated during a previous iteration of the turbo decoding process; and (ii) calculating in parallel, at least forward state metrics and backward state metrics of the multiple windows, during the current iteration.

20 Claims, 13 Drawing Sheets

DEVICE HAVING TURBO DECODING CAPABILITIES AND A METHOD FOR TURBO DECODING

FIELD OF THE INVENTION

This disclosure relates generally to devices that have turbo decoding capabilities and to methods for turbo decoding.

BACKGROUND OF THE INVENTION

Wireless communication systems are widely deployed to provide various types of communications such as voice and data. One such system is wide band code division multiple access (WCDMA), which has been adopted in various competing wireless communication standards, e.g. third generation partnership project 3GPP, 3GPP project 2 (3GPP2) and long term evolution 3GPP (LTE 3GPP).

To overcome data corruption that can occur during RF transmission, the different wireless communication standards typically include some form of channel coding, where one common channel coding technique is turbo coding.

Turbo coding involves the use of a turbo encoder for encoding a code segment (i.e. a data packet) and a turbo decoder for the decoding of the encoded code segment. A turbo encoder typically includes a pair of convolutional encoders, one of which receives information bits (i.e. systematic bits) while the other convolutional encoder receives interleaved information bits. The information bits are shuffled (interleaved) in accordance with a specified interleaving scheme. The pair of convolutional encoders output two sequences of parity bits that are modulated and transmitted to a receiver. The systematic bits are also modulated and transmitted to the receiver.

The receiver has a turbo decoder that receives so-called channel data. The turbo decoder processes channel data and interleaved channel data in order to reconstruct the data packets that were provided to the turbo encoder. Briefly, turbo decoding includes calculating branch metrics, path metrics (including forward state metrics and backward state metrics), and extrinsic information in a recursive manner.

A channel data block is usually partitioned to windows. The size of these windows is usually set to provide a good trade-off between turbo decoding overhead and memory requirement. In many prior art devices even if such a good trade off is provided, each window is preceded by a "warm up" period in order to compensate for the lack of proper initial conditions.

SUMMARY OF THE PRESENT INVENTION

The present invention provides a method and a device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

DETAILED DESCRIPTION OF THE DRAWINGS

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

Figure 1:
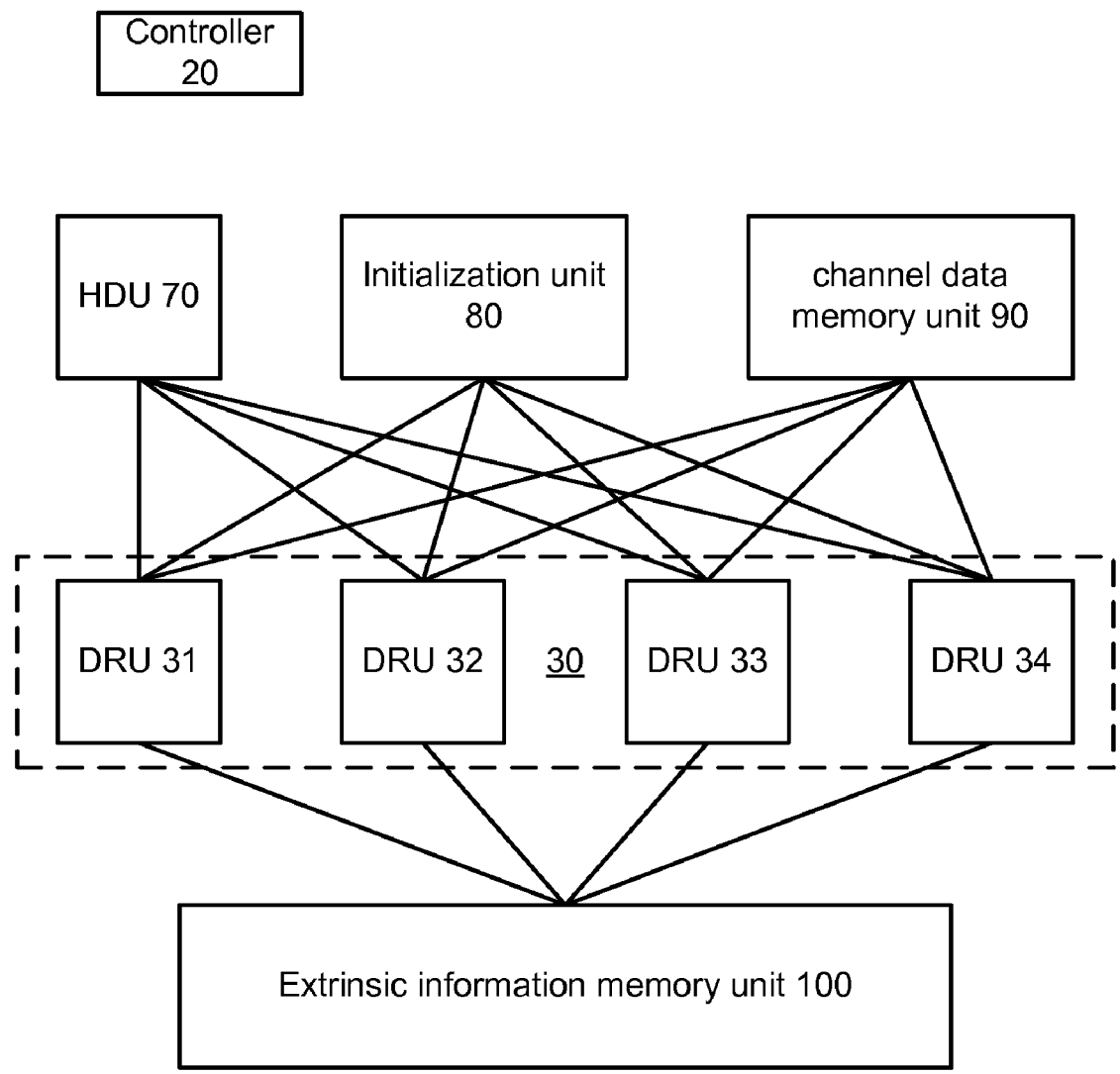
FIG. 1 schematically shows an example of an embodiment of a device that has turbo decoding capabilities.

It has been found that FIG. 1 schematically shows an example of an embodiment of device 10 that has turbo decoding capabilities.

A device that has turbo decoding capabilities can include: (i) a controller adapted to control multiple iterations of a turbo decoding process until a turbo decoding process is completed; (ii) a group of recursion units that comprises multiple forward recursion units and multiple backward recursion units. The group may be adapted to calculate in parallel, at least forward state metrics and backward state metrics of multiple windows, during a current iteration out of the multiple iterations; and (iii) an initialization unit adapted to initialize at least one state metric of multiple windows of a channel data block for the current iteration of the turbo decoding process by at least one corresponding state metric that was calculated during a previous iteration of the turbo decoding process.

Device 10 can have information (data and/or media) processing capabilities. Device 10 can be a base station, a part of a base station, a mobile device and the like.

In the show example, device 10 includes various components such as controller 20, group of recursion units 30, hard decision unit 70, initialization unit 80, channel data memory unit 90, and extrinsic information memory unit 100.

Controller 20 is adapted to control multiple iterations of a turbo decoding process until this process is completed. Controller 20 is connected to various components of device 10 such as group of recursion units 30, hard decision unit 70, initialization unit 80, and then like. Controller 20 can also be connected to various memory modules such as channel data memory unit 90 and extrinsic information memory unit 100. For simplicity of explanation, these connections are not shown in FIG. 1.

Group of recursion units 30 includes multiple forward recursion units and multiple backward recursion units. A forward recursion unit can calculate forward state metrics. Additionally, the unit may calculate at least one of the following: branch metrics, extrinsic information and hard decisions. A backward recursion unit can calculate backward state metrics. Additionally, a backward recursion unit may calculate at least one of the following: branch metrics, extrinsic information and hard decisions. Pairs of forward and backward recursion units can be integrated to form dual recursion units (DRUs).

In the example of FIG. 1, each DRU out of 31-34 is connected to hard decision unit 70, to initialization unit 80, to channel data memory unit 90, and to extrinsic information memory unit 100.

Hard decision unit 70 stores hard decisions.

Channel data memory unit 90 stores channel data, usually one or two windows of channel data block at a time. It can store the whole data channel block or any portion thereof.

Extrinsic information memory unit 100 stores extrinsic information.

In this example, device 10 implements both a so-called X-architecture and a next iteration initialization (NII) technique. The X-architecture implies that forward state metrics and backward state metrics of certain windows are calculated in parallel without a substantial latency between the calculation of the forward state metrics and backward state metrics of the certain windows. NII implies that the initial values of multiple path metrics for a so-celled current iteration of the turbo decoding process are set to be path metrics that were calculated during a previous iteration of the turbo decoding process. The combination of these techniques speeds up the turbo decoding process.

In addition, path metrics that were calculated for a certain window can be used to initiate path metrics of an adjacent window.

Figure 2:
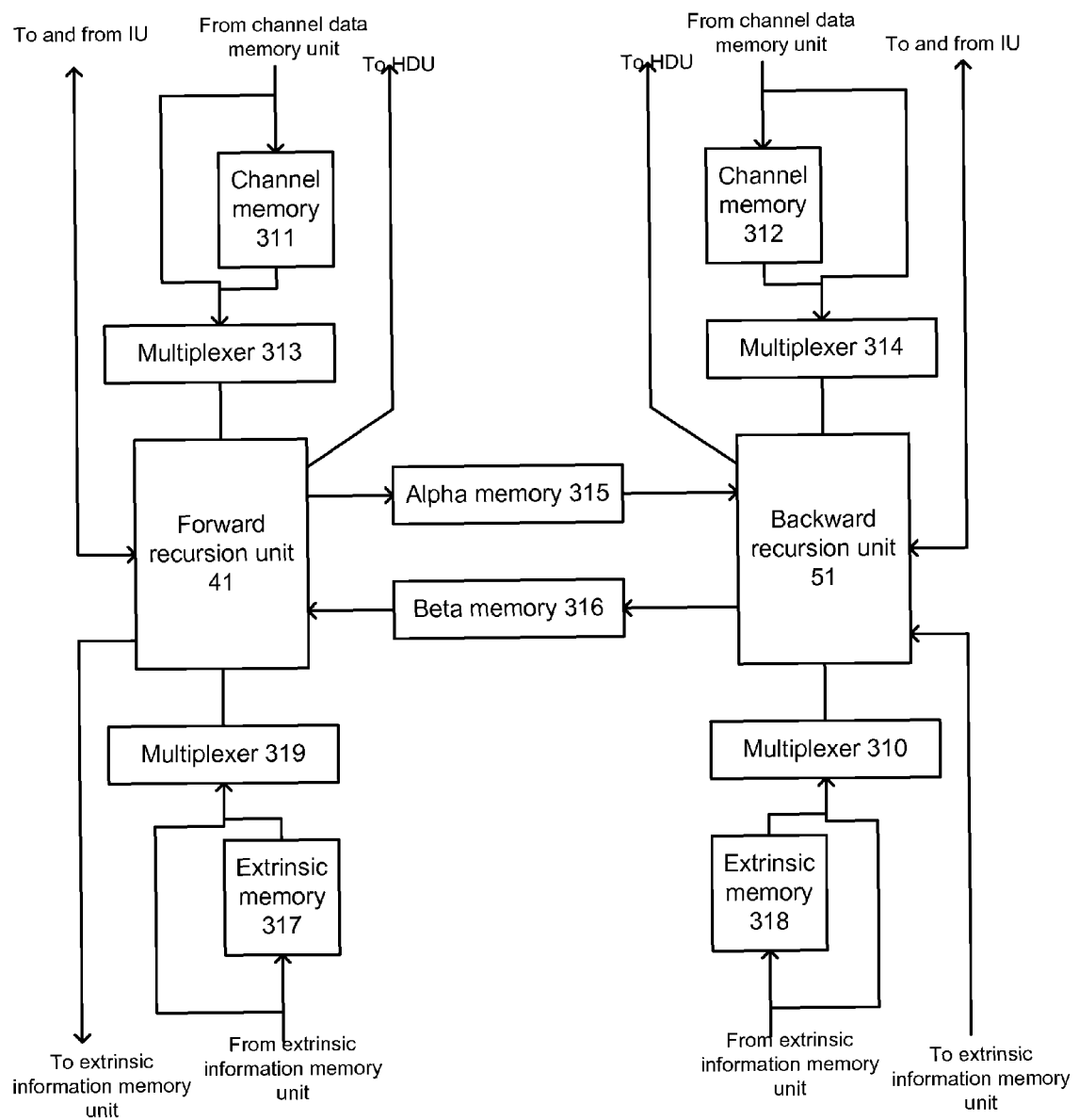
FIG. 2 schematically shows an example of an embodiment of a dual recursion unit.
Figure 3:
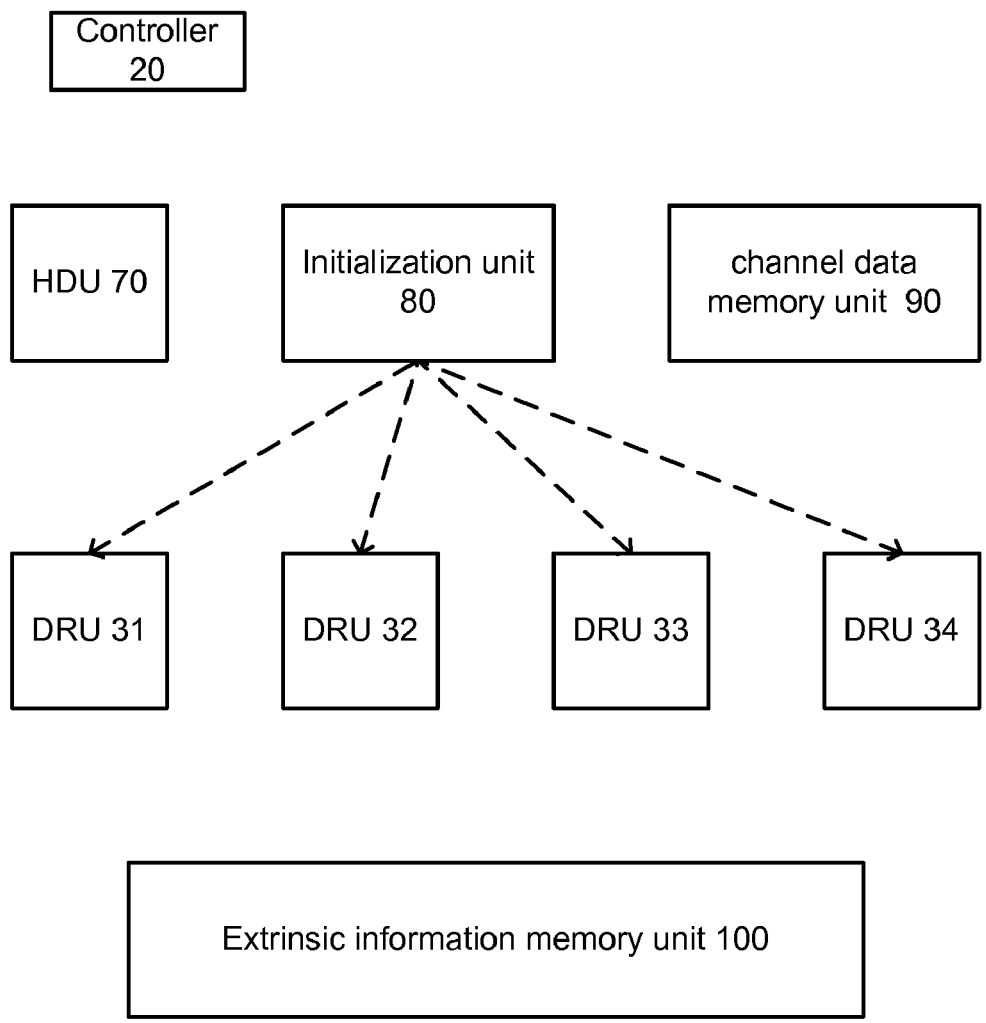
FIG. 3-6 schematically show examples of an embodiment of a device that has turbo decoding capabilities and transfer of information between components of the device.
Figure 4:
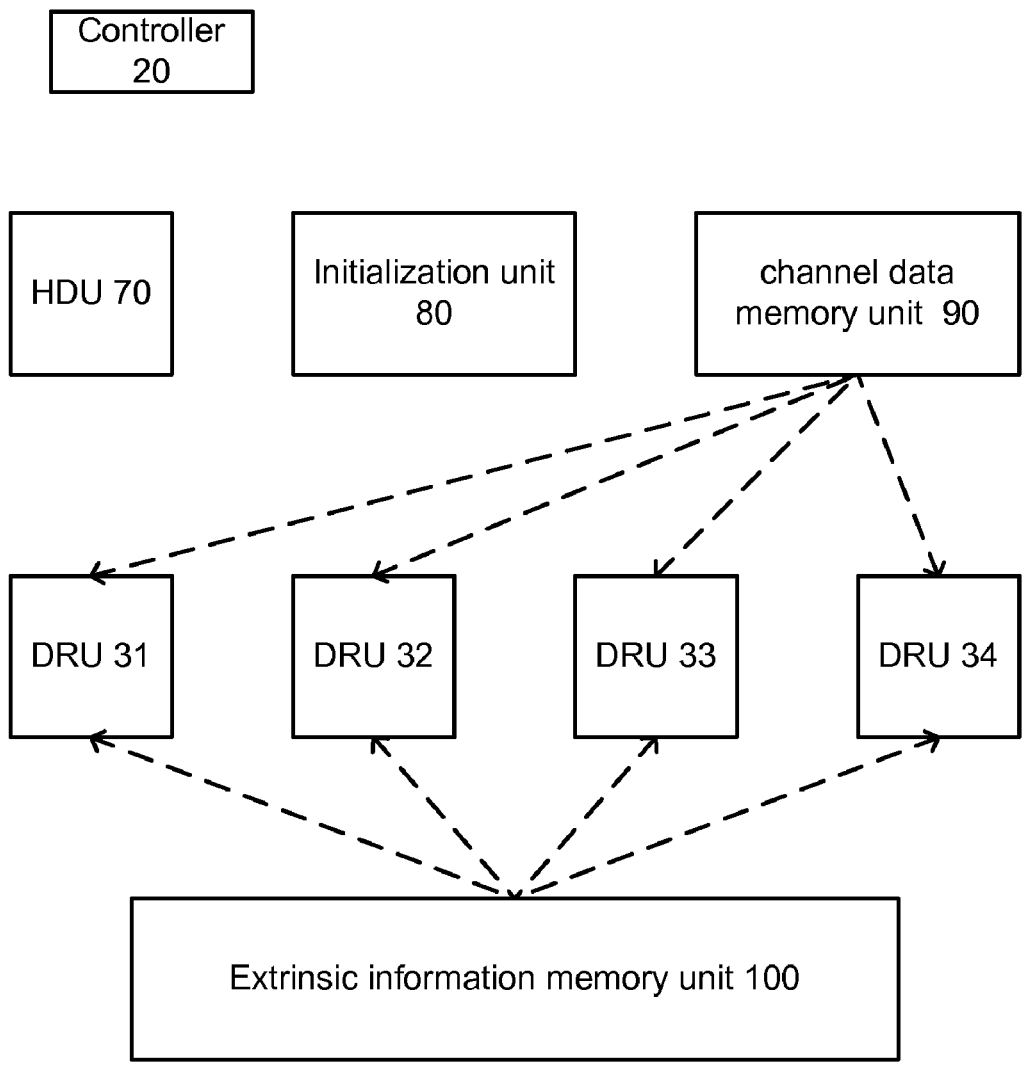
Figure 5:
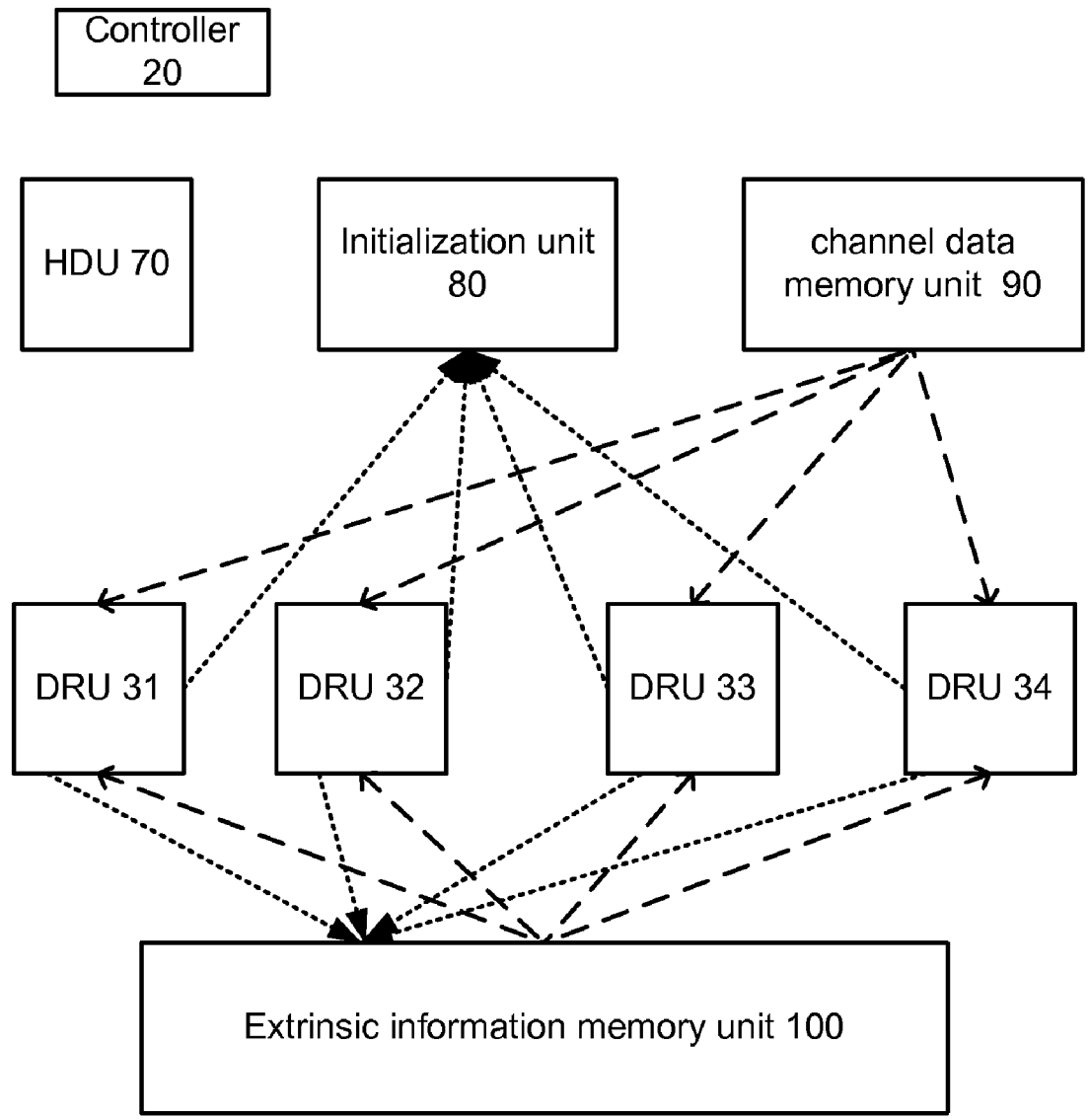
Figure 6:
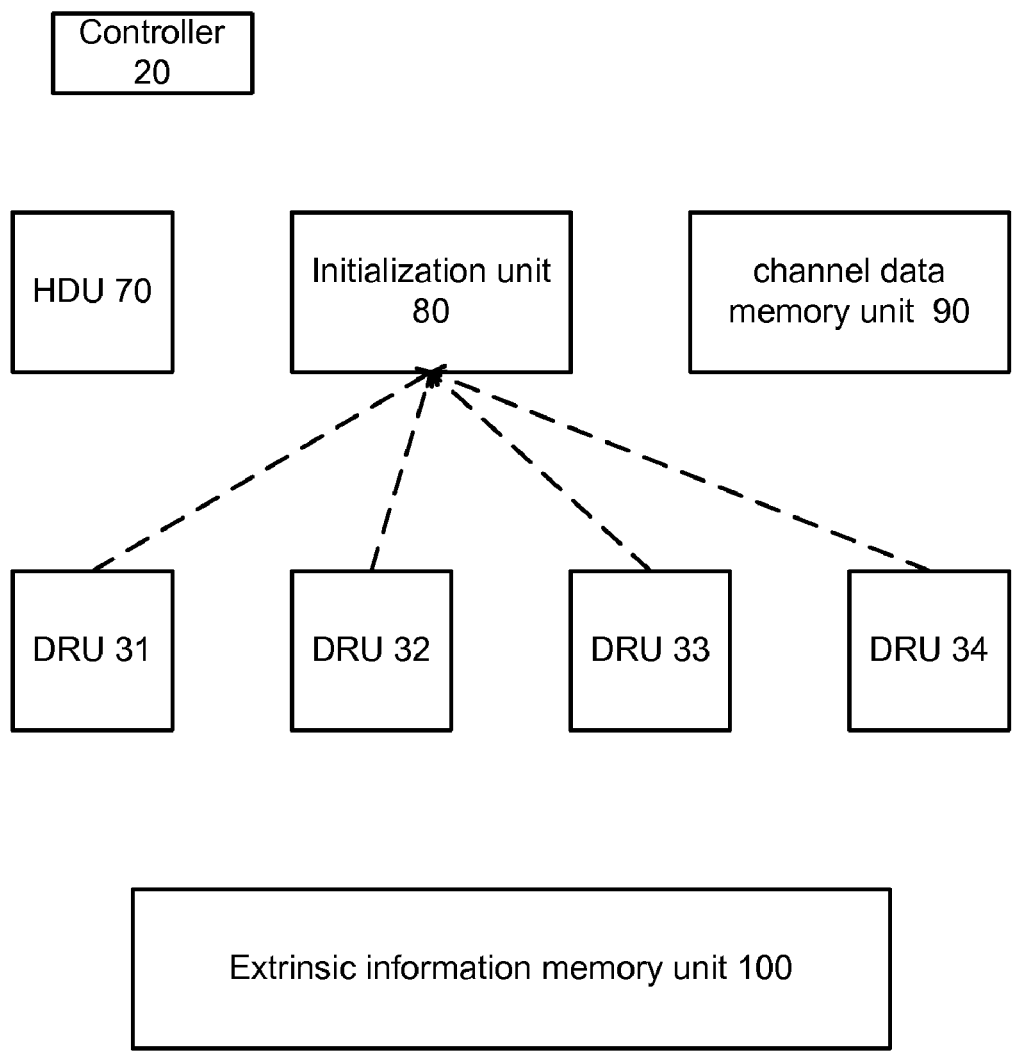
Figure 7:
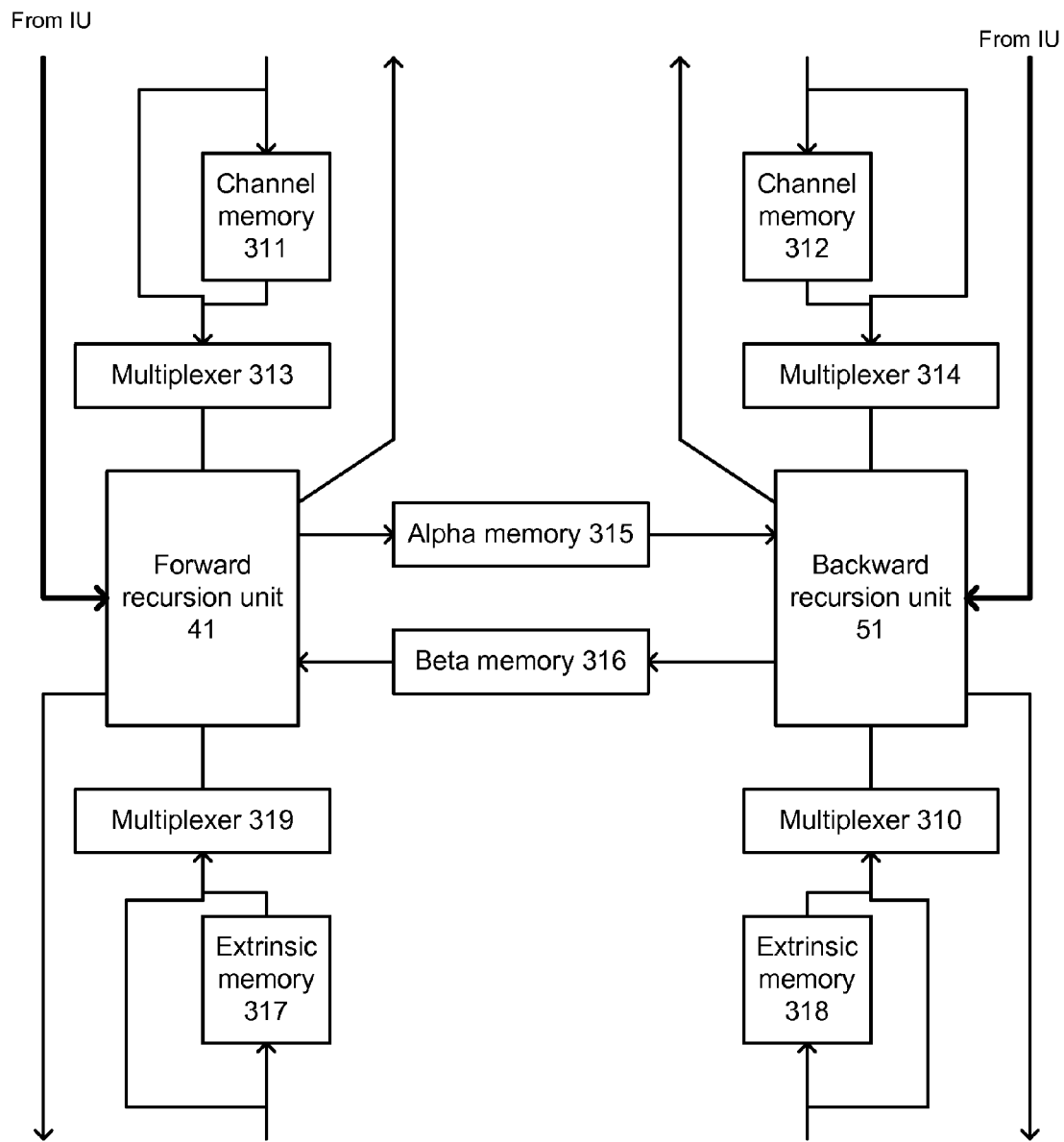
FIG. 7-10 schematically show examples of an embodiment of a dual recursion element and transfer of information to and from components of the dual recursion element.
Figure 8:
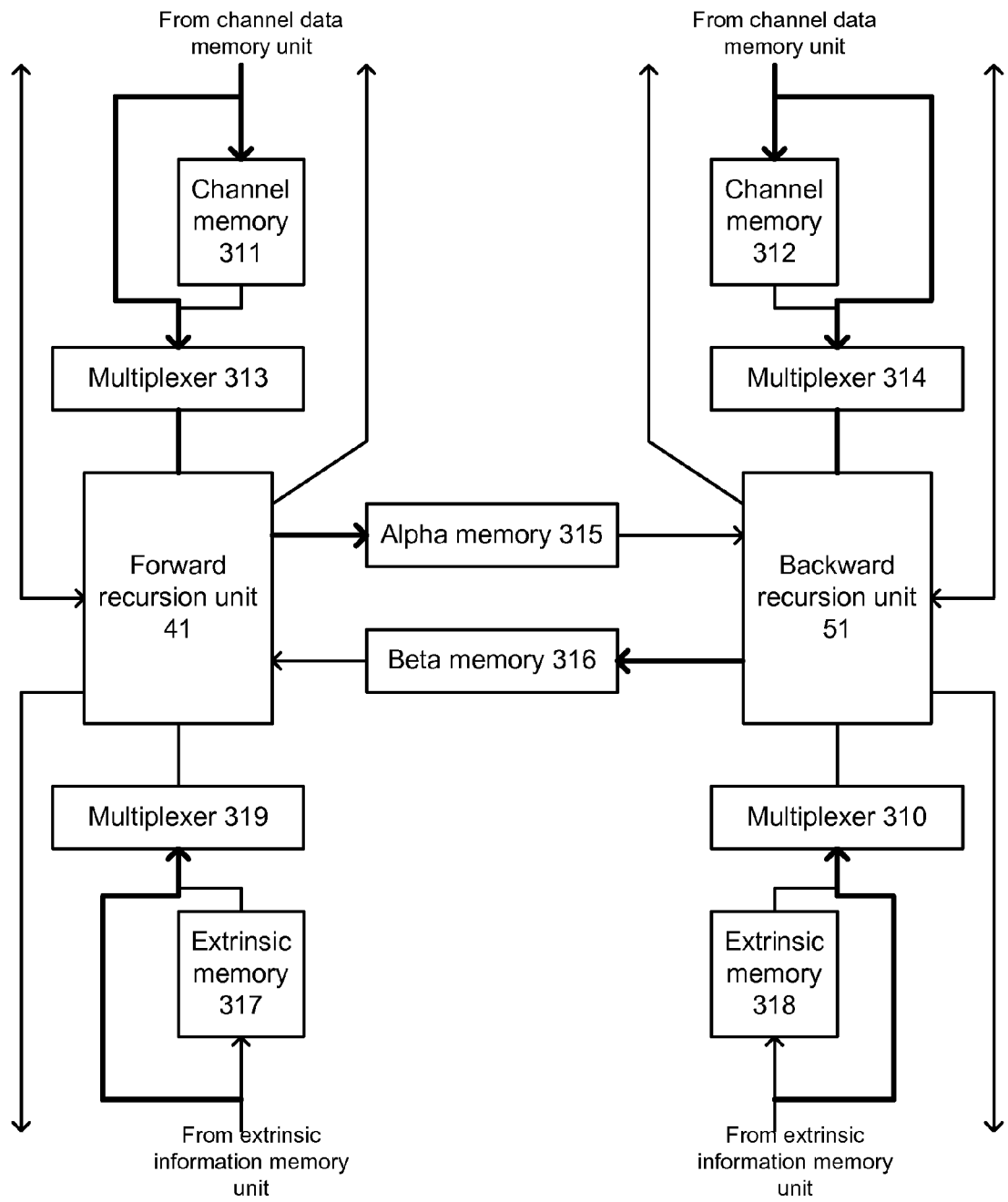
Figure 9:
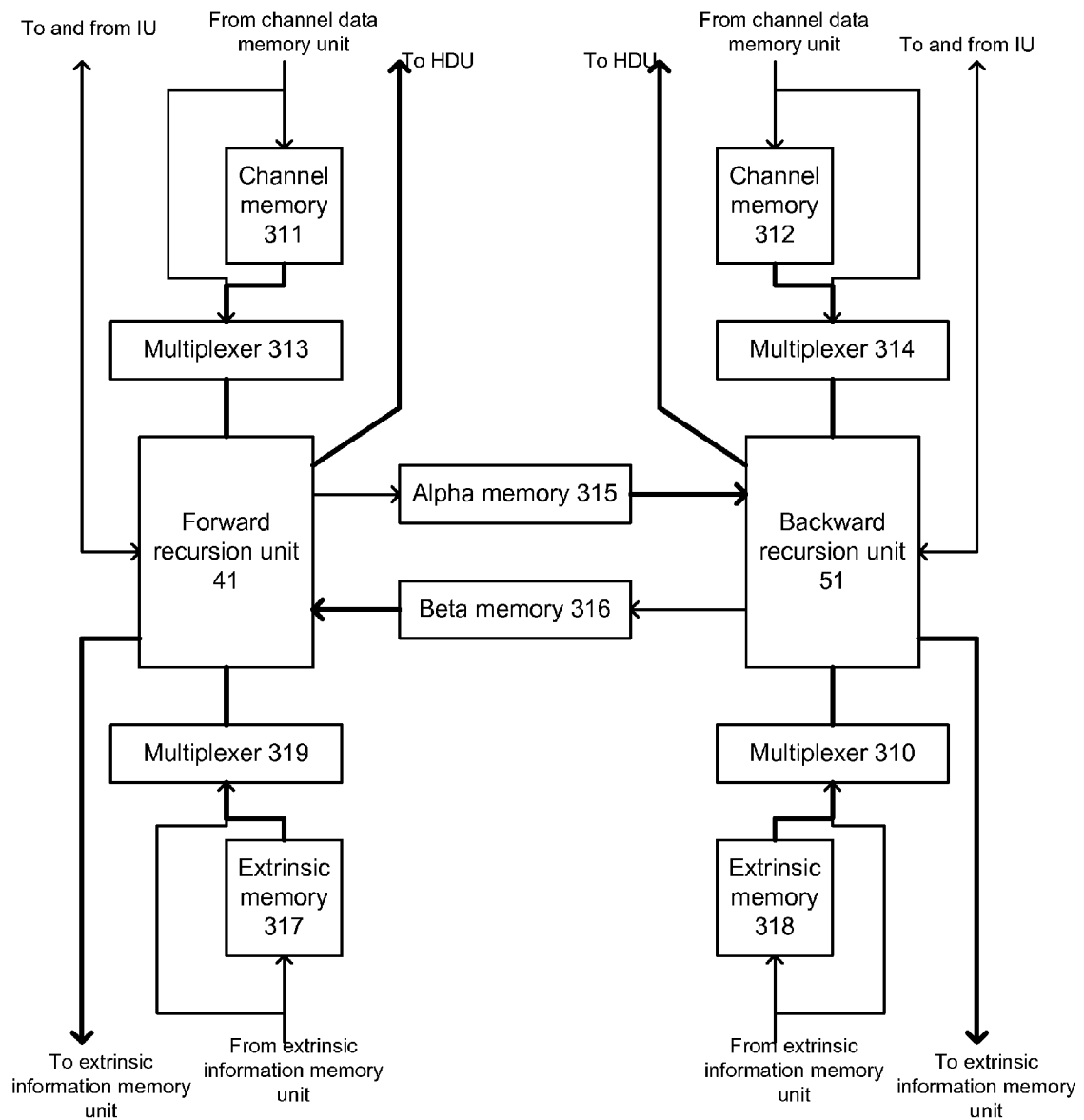
Figure 10:
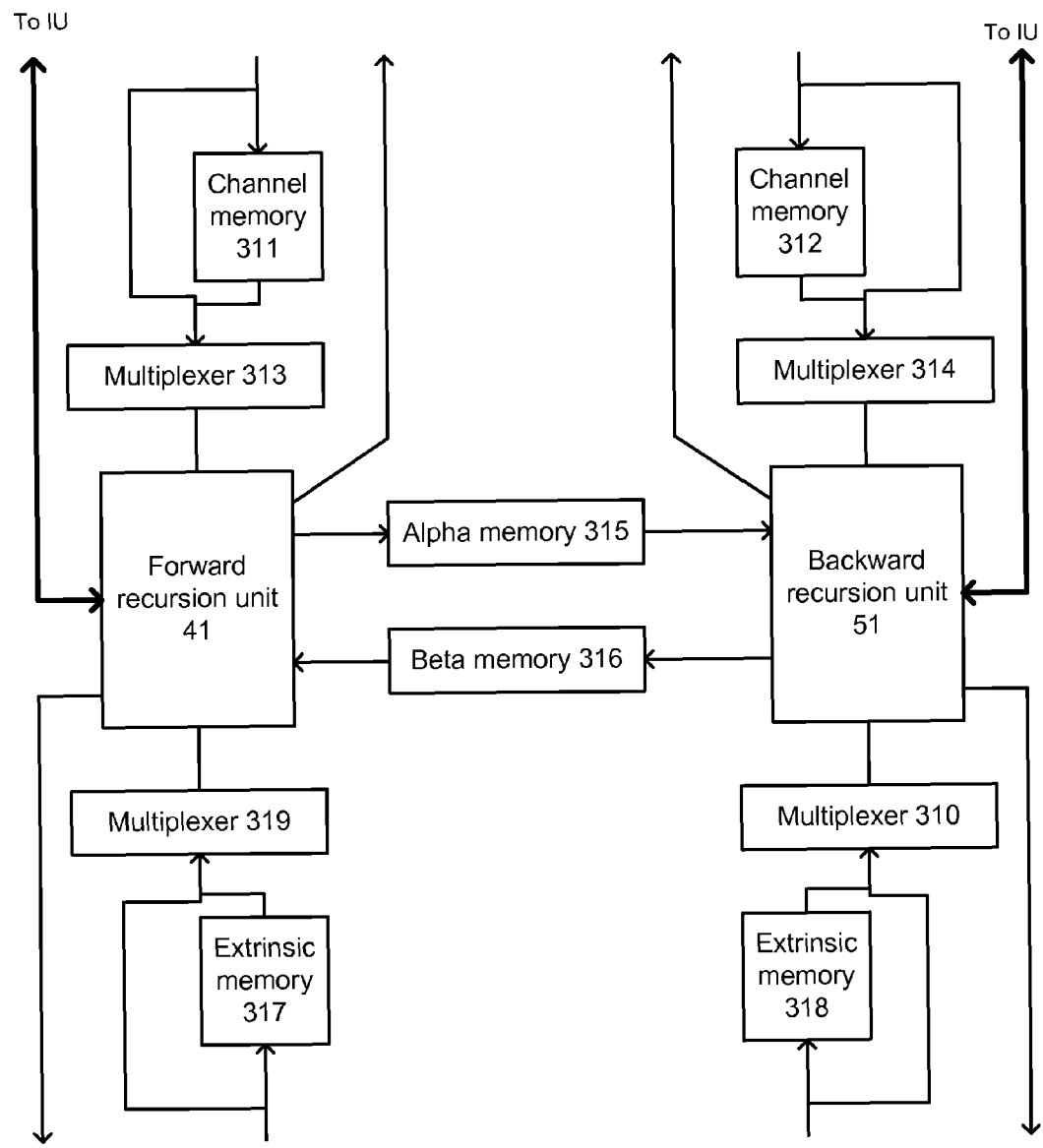

FIG. 2 schematically shows an example of an embodiment of dual recursion unit (DRU) 31.

The shown example of DRU 31 includes: channel memories 311 and 312, multiplexers 313 and 314, forward recursion unit 41, backward recursion unit 51, alpha memory 315, beta memory 316, extrinsic memories 317 and 318 and multiplexers 319 and 310.

Alpha memory 315 and beta memory 316 are connected to forward recursion unit 41 and to backward recursion unit 51. Forward recursion unit 41 is connected to multiplexer 313 for receiving channel data and is connected to multiplexer 319 for receiving extrinsic information. Backward recursion unit 51 is connected to multiplexer 314 for receiving channel data and is connected to multiplexer 310 for receiving extrinsic information.

Multiplexer 313 can select between channel data received by an input of DRU 31 (thereby bypassing channel memory 311) and channel data (previously received by DRU 31) that is stored in channel memory 311. Multiplexer 314 can select between channel data received by an input of DRU 31 (thereby bypassing channel memory 312) and channel data (previously received by DRU 31) that is stored in channel memory 312.

Multiplexer 317 can select between extrinsic information received by an input of DRU 31 (thereby bypassing extrinsic memory 317) and channel data (previously received by DRU 31) that is stored in extrinsic memory 317. Multiplexer 310 can select between extrinsic information received by an input of DRU 31 (thereby bypassing extrinsic memory 318) and extrinsic information (previously received by DRU 31) that is stored in extrinsic memory 318.

Various examples of a turbo decoding process will be explained in further details in relation to FIG. 3-FIG. 10.

Table 1 summarizes two iterations of a turbo decoding process, starting from the first iteration. Table 1 includes various acronyms, for example, DRU stands for a dual recursive unit (such as 31, 32, 33 or 34), IU stands for initialization unit 80, ZTT stands for a zero Trellis termination algorithm, TB stands for a tail biting algorithm, HDU is hard decision unit 70. In addition, alpha is a forward state metric and beta is a backward state metric.

Table 1 includes four columns—the leftmost column (titled "stage") indicates the stage (initialization of an iteration, iteration itself, end of iteration), the next column (titled "Transfer of information, non-DRU operations") indicates transfer of information between components (mostly information transfers) and operations that are executed by components that differ from DRUs, the next column (titled "Interaction within DRU") indicates operations that occur within a DRU, and the rightmost column (titled "FIG.") indicates which are the relevant figures.

It is noted that the calculation process of path metrics of a window includes a north portion and a south portion. The calculation process starts by the north portion and ends by the south portion. The north portion includes calculating the leftmost alpha till the middle of window alpha and calculating the rightmost beta till the middle of the window beta. The south portion starts after the middle of window alphas and betas were calculated and ends when the rightmost alpha and the leftmost beta are calculated.

FIG. 3-FIG. 6 illustrate the transfer of information between components while FIG. 7-FIG. 10 illustrate the transfer of information between DRU components and other components. These information transfers are illustrated by dashed arrows.

TABLE 1

| Stage | Transfer of information, non-DRU operations | Interaction within DRU | FIG. |
|---|---|---|---|
| Initialization of first iteration | IU sends initialized path metrics to DRUs (ZTT, TB). | Store initialized path metrics | 3, 7 |
| North portion, non-interleaved | Send non-interleaved channel data and extrinsic information to DRUs. DRUs calculate alphas and betas. | Store channel data in channel memory of DRU, calculate, alphas, betas and branch metrics, store alphas and betas in alphas and betas memory. | 4, 8 |
| South portion, non-interleaved | | Calculate alphas and betas. Calculate branch metrics, extrinsic information and send to HDU. Calculation is responsive to alphas and betas calculated during previous north portion. | 9 |
| End of first half of first iteration | Send last alphas and last betas to IU. HDU generates hard decision | Output last alphas and last betas from DRU. | 5, 6, 10 |
| Initialization of second half of first iteration | IU sends initialized path metrics to DRUs (ZTT, TB) | Store initialized path metrics | 3, 9 |
| North portion, interleaved | Send interleaved channel data and extrinsic information to DRUs. | Store channel data in channel memory of DRU, calculate, alphas, betas and branch metrics, store alphas and betas in alphas and betas memory. | 4, 8 |

TABLE 1-continued

| Stage | Transfer of information, non-DRU operations | Interaction within DRU | FIG. |
|---|---|---|---|
| South portion, interleaved | | Calculate alphas and betas. Calculate branch metrics, extrinsic information and send to HDU. Calculation is responsive to alphas and betas calculated during previous north portion. | 9 |
| End of first iteration | Send last alphas and last betas to IU. HDU generates hard decision | Output last alphas and last betas from DRU. | 5, 6, 10 |
| Initialization of second iteration | IU sends final alphas and betas of first iteration as initialized path metrics to DRUs | Store initialized path metrics | 2, 8 |
| North portion, non-interleaved | Send channel data and extrinsic information to DRUs. | Store channel data in channel memory of DRU, calculate, alphas, betas and branch metrics, store alphas and betas in alphas and betas memory. | 4, 8 |
| South portion, non-interleaved | | Calculate alphas and betas. Calculate branch metrics, extrinsic information and send to HDU. Calculation is responsive to alphas and betas calculated during previous north portion. | 9 |
| End of first half of second iteration | Send last alphas and last betas to IU. HDU generates hard decision | Output last alphas and last betas from DRU. | 5, 6, 10 |
| Initialization of second half of second iteration | IU sends final alphas and betas of second iteration as initialized path metrics to DRUs | Store initialized path metrics | 3, 9 |
| North portion, non-interleaved | Send non-interleaved channel data and extrinsic information to DRUs. | Store channel data in channel memory of DRU, calculate, alphas, betas and branch metrics, store alphas and betas in alphas and betas memory. | 4, 8 |
| South portion, non-interleaved | | Calculate alphas and betas. Calculate branch metrics, extrinsic information and send to HDU. Calculation is responsive to alphas and betas calculated during first half of fourth iteration. | 9 |
| End of second iteration | Send last alphas and last betas to IU. HDU generates hard decision | Output last alphas and last betas from DRU. | 5, 6, 10 |

Figure 11:
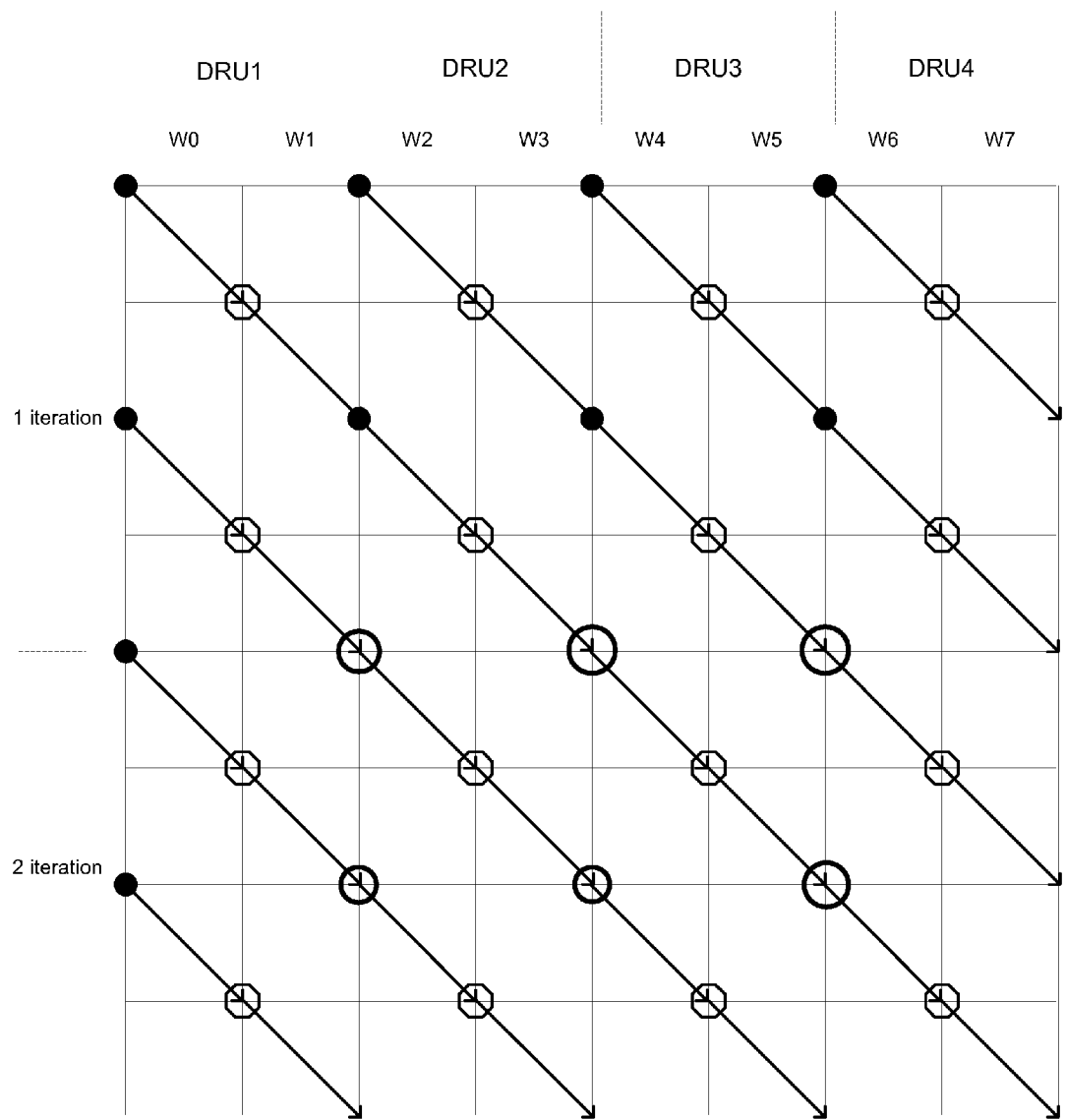
FIG. 11 schematically shows an example of an embodiment of forward state metric calculations.
Figure 12:
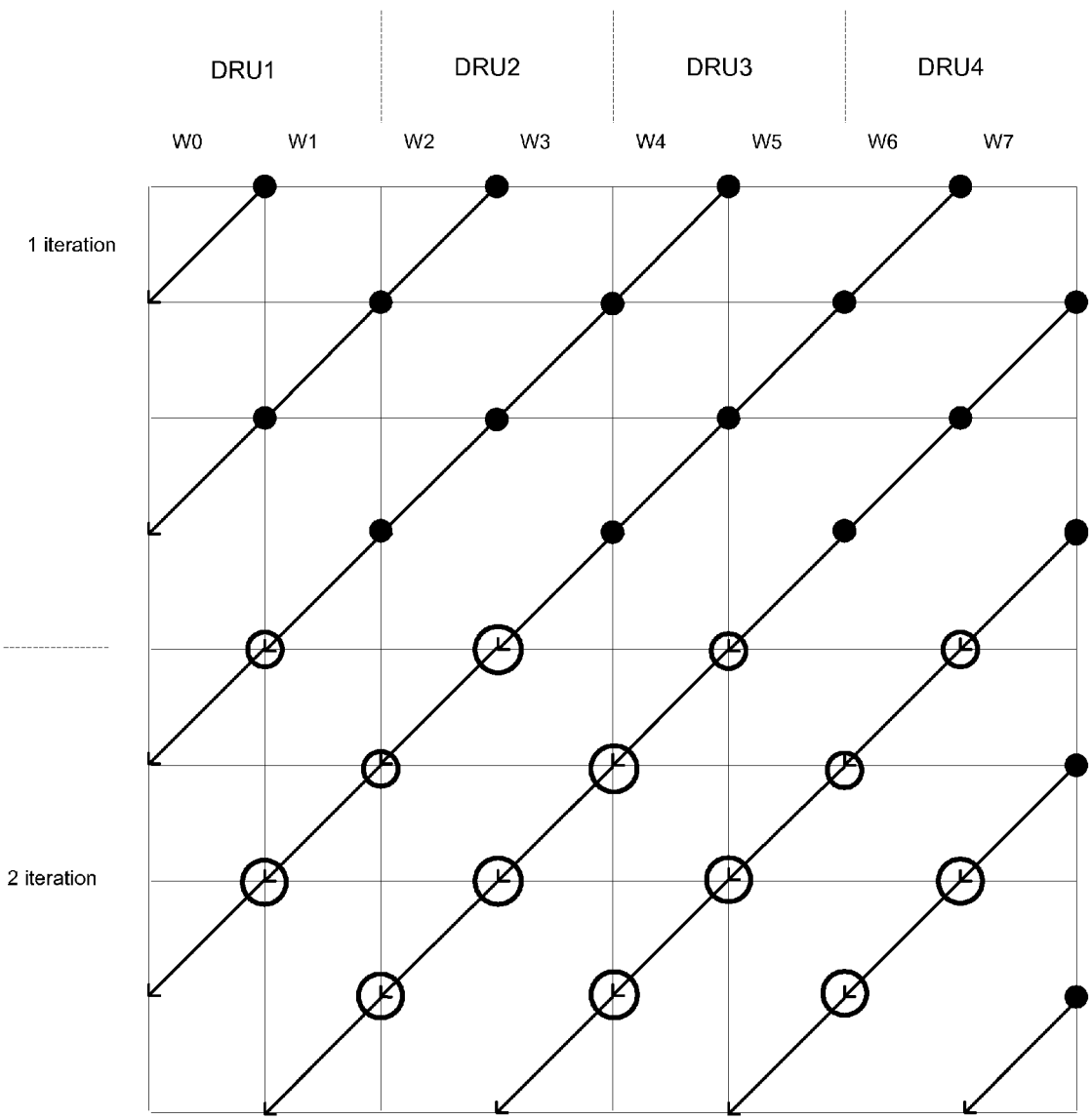
FIG. 12 schematically shows an example of an embodiment of backward state metric calculations.

FIG. 11 illustrates the calculation of forward state metrics by DRUs 31, 32, 33 and 34 during four iterations. FIG. 12 illustrates the calculation of backward state metrics by DRUs 31, 32, 33 and 34 during two iterations. Alpha and beta calculations are illustrates by oriented arrows. ZTT or BT initialization of path are indicates by black circles. Initialization of path metrics between the first half of an iteration to a second half are indicated by a hollow pentagon. Initializations between iterations are indicated by hollow circles.

Table 2 summarizes the operations illustrated in FIG. 11 and FIG. 12. Table 2 is based upon the following assumptions: (i) there are eight windows that are referred to as W0-W7, W0 being the leftmost window; (ii) a ZTT algorithm is applies and it sets all alphas except the leftmost alpha to zero, it also sets all betas except the rightmost beta to zero, (iii) the odd iterations are iterations that involve processing channel data while the even iterations are iterations that involve processing interleaved channel data. During the first and third quarters of each iteration non-interleaved channel data is received and processed. During the second and fourth quarter of each iteration interleaved channel data is received and processed.

TABLE 2

| Stage | Alpha and beta calculation and related actions of DRUs 31-34 |
|---|---|
| Initialization of first iteration. | Alpha of W0 differs from zero. It can be received from IU. Alphas of W2, W4, and W6, betas of W0, W2, W4 and W6 are set to zero. |
| First quarter of first iteration | DRUs 31, 32, 33 and 34 calculate alphas and betas of W0, W2, W4, and W6 respectively. |
| Initialization of second quarter of first iteration | Alphas of W1, W3, W5, and W7 are the last alphas of W0, W2, W4, and W6. Betas of W2, W4, and W6 are set to zero. Beta of W7 differs from zero it can be received from IU. |
| second quarter of first iteration | DRUs 31, 32, 33 and 34 calculate alphas and betas of W1, W3, W5, and W7 respectively. |
| Initialization of third quarter of first iteration | Alpha of W0 differs from zero. It can be received from IU. Alphas of W2, W4, and W6 betas of W0, W2, W4, and W6 are set to zero. |
| third quarter of first iteration | DRUs 31, 32, 33 and 34 calculate alphas and betas of W0, W2, W4, and W6 respectively. |
| Initialization of fourth quarter of first iteration | Alphas of W1, W3, W5, and W7 are the last alphas of W0, W2, W4, and W6. Betas of W2, W4, and W6 are set to zero. Beta of W7 differs from zero it can be received from IU. |
| fourth quarter of first iteration | DRUs 31, 32, 33 and 34 calculate alphas and betas of W1, W3, W5, and W7 respectively. |
| Initialization of second iteration. | Alpha of W0 differs from zero. It can be received from IU. Alphas of W2, W4, and W6 are last alphas of W1, W3, and W5 from a first half of first iteration. Betas of W0, W2, W4, and W6 are last betas of W1, W3, W5, and W7 a from first half of first iteration. |
| First quarter of second iteration | DRUs 31, 32, 33 and 34 calculate alphas and betas of W0, W2, W4, and W6 respectively. |
| Initialization of second quarter of second iteration | Beta of W7 differs from zero it can be received from IU. Alphas of W1, W3, W5, and W7 are last alphas of W0, W2, W4, and W6 from a first half of first iteration. Betas of W1, W3, and W5 are last betas of W2, W4, and W6 from a first half of first iteration. |
| second quarter of second iteration | DRUs 31, 32, 33 and 34 calculate alphas and betas of W1, W3, W5, and W7 respectively. |
| Initialization of third quarter of second iteration | Alpha of W0 differs from zero. It can be received from IU. Alphas of W2, W4, and W6 are last alphas of W1, W3, and W5 from a second half of first iteration. Betas of W0, W2, W4, and W6 are last betas of W1, W3, W5, and W7 from second half of first iteration. |
| third quarter of second iteration | DRUs 31, 32, 33 and 34 calculate alphas and betas of W0, W2, W4, and W6 respectively. |

TABLE 2-continued

| Stage | Alpha and beta calculation and related actions of DRUs 31-34 |
|---|---|
| Initialization of fourth quarter of second iteration | Beta of W7 differs from zero it can be received from IU.<br>Alphas of W1, W3, W5, and W7 are last alphas of W0, W2, W4, and W6 from a second half of first iteration.<br>Betas of W1, W3, and W5 are last betas of W2, W4, and W6 from a second half of first iteration. |
| fourth quarter of second iteration | DRUs 31, 32, 33 and 34 calculate alphas and betas of W1, W3, W5, and W7 respectively. |

It is noted that is BT is applied then at the initialization of the second and fourth quarters of the each of the first and iteration the beta pf W7 equals the last alphas of W1 from a previous quarter.

It is further noted that a north portion of one or more windows can be calculated in parallel to one or more south portions of one or other windows.

Figure 13:
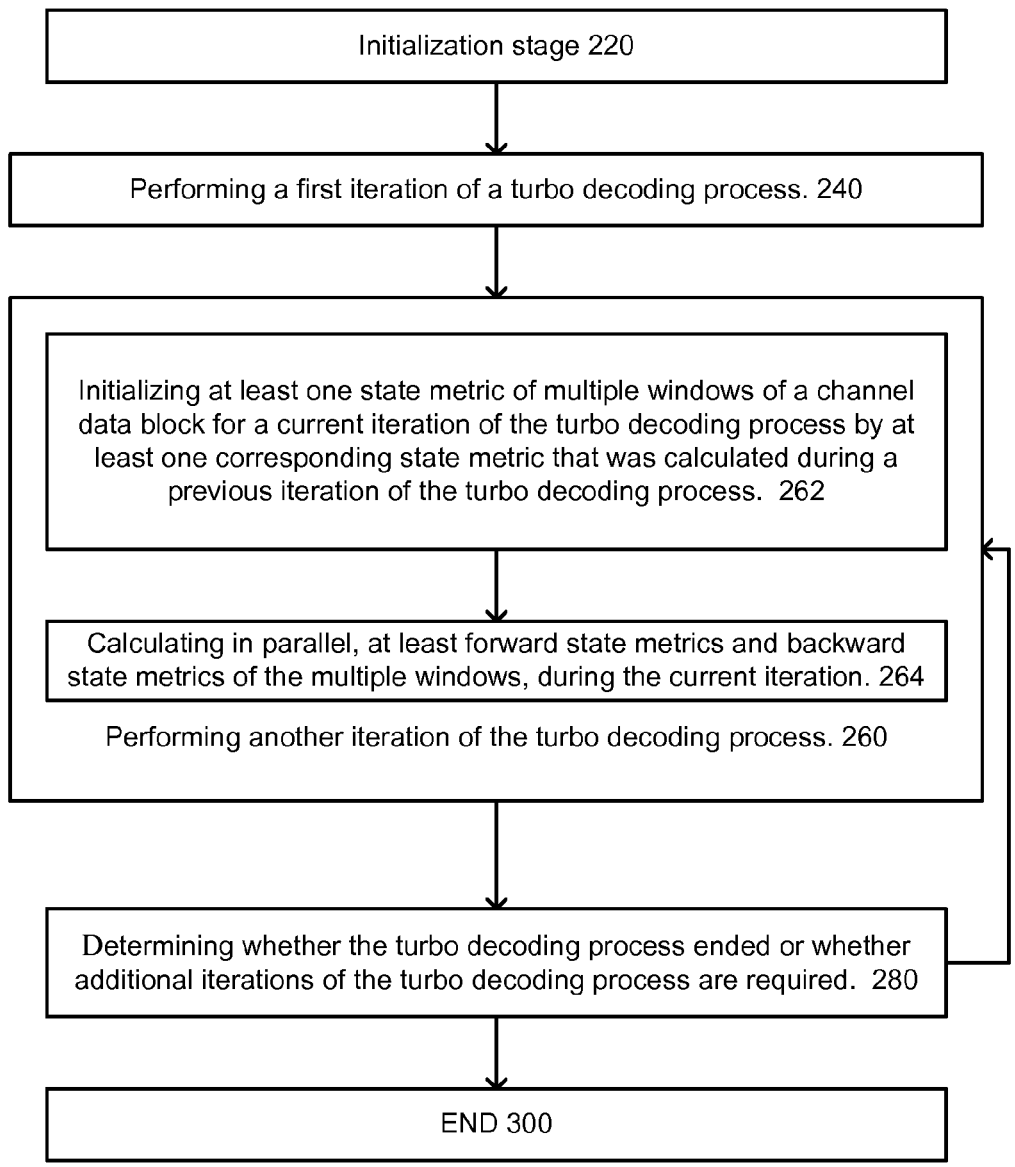
FIG. 13 schematically shows an example of an embodiment of a method for turbo decoding.

FIG. 13 schematically shows an example of an embodiment of method 200 for turbo decoding.

Method 200 starts by initialization stage 220. During the initialization stage the number of iterations can be set, ZTT information or TB information can be received and channel data can be stored in a memory unit that can be accessed (directly or indirectly) by DRUs.

Stage 220 is followed by stage 240 of performing a first iteration of a turbo decoding process.

Stage 220 can include initializing at least one state metric, for example by applying tail biting algorithm or a zero Trellis termination algorithm. These algorithms can be used for initializing the leftmost alpha and the rightmost betas during stage 260.

Stage 240 is followed by stage 260 of performing another iteration of the turbo decoding process.

Stage 260 includes stage 262 of initializing at least one state metric of multiple windows of a channel data block for a current iteration of the turbo decoding process by at least one corresponding state metric that was calculated during a previous iteration of the turbo decoding process. The previous iteration can be the penultimate iteration.

Stage 262 is followed by stage 264 of calculating in parallel, at least forward state metrics and backward state metrics of the multiple windows, during the current iteration. The term "at least" indicates that stage 264 also can include calculating other elements such as but not limited to branch metrics, extrinsic information, hard decisions, or a combination thereof.

Various example of stage 260 were illustrates by tables 1 and 2. Referring to the example of previous figures, stage 260 can include multiple data transfers between components of a device, multiple data transfers to and from DRU components and multiple initialization stages.

Stage 260 can include calculating extrinsic information and initializing the at least one state metric by at least one corresponding state metric that was calculated during a last iteration during which extrinsic calculation was calculated in response to interleaved channel data.

Assuming that there are K windows within the channel data block then stage 262 of initializing can include initializing forwards metrics of (K-1) windows corresponding forward metrics that were calculated during the previous iteration.

Stage 264 can include calculating in parallel forward state metrics and backward state metrics of four windows out of eight windows of the channel data block, during the current iteration.

Stage 260 is followed by stage 280 of determining whether the turbo decoding process ended or whether additional iterations of the turbo decoding process are required. Usually the number of iterations is set in advance and stage 280 includes comparing the number of iterations to the predefined iterations limit. The turbo process can be stopped according to results of the turbo decoding.

If the turbo decoding process did not end then stage 280 is followed by stage 260, else stage 280 is followed by "END" stage 300.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The mere fact that certain measures are recited in mutually different claims does not indicate that a combination of these measures cannot be used to advantage.

We claim:

1. A method for turbo decoding, the method comprises:
    initializing a first iteration of a turbo decoding process by setting a state metric of a window of multiple windows of a channel data block with data stored in a memory unit, and setting the remaining state metrics of the remaining multiple windows to zero;
    calculating in parallel, during the first iteration, at least forward state metrics and backward state metrics of the multiple windows; and
    performing multiple additional iterations of the turbo decoding process until the turbo decoding process is completed;
    wherein the performing the multiple additional iterations comprises repeating the stages of:
        initializing at least one state metric of multiple windows of the channel data block for a current iteration of the turbo decoding process by at least one corresponding state metric that was calculated during a previous iteration of the turbo decoding process; and
        calculating in parallel, during the current iteration, at least forward state metrics and backward state metrics of the multiple windows.

2. The method according to claim 1 comprising:
    calculating extrinsic data in response to interleaved channel data; and
    initializing the at least one state metric by at least one corresponding state metric that was calculated during a last iteration during which extrinsic calculation was calculated in response to interleaved channel data.

3. The method according to claim 1 wherein there are K windows within the channel data block and wherein the initializing comprises initializing forwards metrics of (K−1) windows corresponding forward metrics that were calculated during the previous iteration.

4. The method according to claim 1 comprising calculating in parallel forward state metrics and backward state metrics of four windows out of eight windows of the channel data block.

5. The method according to claim 1 comprising performing a zero trellis termination initialization of a forward metric of a leftmost window.

6. The method according to claim 1 comprising performing a tail biting initialization of a forward metric of a leftmost window.

7. A device having turbo encoding capabilities, the device comprises:
    a controller adapted to control multiple iterations of a turbo decoding process until a turbo decoding process is completed;
    a group of recursion units that comprises multiple forward recursion units and multiple backward recursion units; the group is adapted calculate in parallel, at least forward state metrics and backward state metrics of the multiple windows, during a current iteration out of the multiple iterations; and
    an initialization unit adapted to initialize a first iteration of the turbo decoding process by setting a state metric of a window of multiple windows of a channel data block with data stored in a memory unit, and setting the remaining state metrics of the remaining windows to zero, and to initialize a next iteration of the turbo decoding process by setting at least one state metric of multiple windows of the channel data block for the next iteration of the turbo decoding process by at least one corresponding state metric that was calculated during a previous iteration of the turbo decoding process.

8. The device according to claim 7 wherein the group of recursion units calculates extrinsic data in response to interleaved channel data; and wherein the initialization unit initializes the at least one state metric by at least one corresponding state metric that was calculated during a last iteration during which extrinsic calculation was calculated in response to interleaved channel data.

9. The device according to claim 7 wherein there are K windows within the channel data block and wherein the initialization unit initializes forwards metrics of (K−1) windows corresponding forward metrics that were calculated during the previous iteration.

10. The device according to claim 7 wherein the group of recursion units comprises four forward state metrics calculators and four backward state metrics calculators that operate in parallel to each other.

11. The device according to claim 7 wherein the initialization unit performs a zero Trellis termination initialization of a forward metric of a leftmost window.

12. The device according to claim 7 wherein the initialization unit performs a tail biting initialization of a forward metric of a leftmost window.

13. A method for turbo decoding, the method comprises:
    setting a forward state metric of a window of multiple windows of a channel data block with data stored in a memory unit, and setting the remaining forward state metrics of the remaining windows to zero;
    calculating in parallel, during a first iteration, at least forward state metrics and backward state metrics of the multiple windows; and
    performing multiple iterations of a turbo decoding process until a turbo decoding process is completed;
    wherein the performing comprises repeating the stages of:
        initializing at least one state metric of multiple windows of a channel data block for a current iteration of the turbo decoding process by at least one corresponding state metric that was calculated during a previous iteration of the turbo decoding process; and
        calculating in parallel, during the current iteration, the at least forward state metrics and backward state metrics of the multiple windows.

14. The method according to claim 13 comprising:
    calculating extrinsic data in response to interleaved channel data; and
    initializing the at least one state metric by at least one corresponding state metric that was calculated during a last iteration during which extrinsic calculation was calculated in response to interleaved channel data.

15. The method according to claim 13 wherein there are K windows within the channel data block and wherein the initializing comprises initializing forwards metrics of (K−1) windows corresponding forward metrics that were calculated during the previous iteration.

16. The method according to claim 13 comprising calculating in parallel forward state metrics and backward state metrics of four windows out of eight windows of the channel data block.

17. The method according to claim 13 comprising performing a zero trellis termination initialization of a forward metric of a leftmost window.

18. The method according to claim 13 comprising performing a tail biting initialization of a forward metric of a leftmost window.

19. The method according to claim 13 further comprising:
setting a backward state metric of a second window of multiple windows of the channel data block with second data stored in the memory unit, and setting the remaining backward state metrics of the remaining windows to zero.

20. The method according to claim 13 wherein the window is a leftmost window of the multiple windows.

* * * * *